US008794010B2

(12) United States Patent
Williams et al.

(10) Patent No.: US 8,794,010 B2
(45) Date of Patent: Aug. 5, 2014

(54) LASER COOLING OF MODIFIED SOI WAFER

(75) Inventors: David L. Williams, Menlo Park, CA (US); Andrew Clark, Palo Alto, CA (US); Michael Lebby, Apache Junction, AZ (US)

(73) Assignee: Translucent, Inc., Palo Alto, CA (US)

( * ) Notice: Subject to any disclaimer, the term of this patent is extended or adjusted under 35 U.S.C. 154(b) by 375 days.

(21) Appl. No.: 12/966,394

(22) Filed: Dec. 13, 2010

(65) Prior Publication Data

US 2012/0147906 A1  Jun. 14, 2012

(51) Int. Cl.
*H01S 3/30* (2006.01)
*H01S 3/034* (2006.01)
*F25B 23/00* (2006.01)
*F25B 21/00* (2006.01)

(52) U.S. Cl.
USPC ............... 62/3.1; 372/34; 372/3; 62/264

(58) Field of Classification Search
USPC ................. 372/3, 34; 62/3.1, 264
See application file for complete search history.

(56) References Cited

U.S. PATENT DOCUMENTS

| | | | | |
|---|---|---|---|---|
| 5,447,032 A | * | 9/1995 | Epstein et al. | 62/3.1 |
| 5,963,680 A | * | 10/1999 | Kleinerman | 385/12 |
| 6,041,610 A | * | 3/2000 | Edwards et al. | 62/264 |
| 6,378,321 B1 | * | 4/2002 | Epstein et al. | 62/264 |
| 6,684,645 B2 | * | 2/2004 | Chu et al. | 62/3.1 |
| 2009/0052482 A1 | * | 2/2009 | Vermeulen et al. | 372/34 |
| 2009/0236595 A1 | * | 9/2009 | Atanackovic | 257/43 |
| 2010/0321649 A1 | * | 12/2010 | Baer | 355/30 |

\* cited by examiner

*Primary Examiner* — Tod T Van Roy
*Assistant Examiner* — Marcia Golub-Miller (57) ABSTRACT

A laser cooling system includes a substrate, an REO layer of single crystal rare earth oxide including at least one rare earth element positioned on the surface of the substrate, and an active layer of single crystal semiconductor material positioned on the REO layer to form a semiconductor-on-insulator (SOI) device. Light guiding structure is at least partially formed by the REO layer so as to introduce energy elements into the REO layer and produce cooling by anti-Stokes fluorescence. The active layer of single crystal semiconductor material is positioned on the REO layer in proximity to the light guiding structure so as to receive the cooling.

24 Claims, 6 Drawing Sheets

LASER COOLING OF MODIFIED SOI WAFER

FIELD OF THE INVENTION

This invention relates to solid state cooling of semiconductor electronic components and more specifically to laser cooling of SOI wafers and the like.

BACKGROUND OF THE INVENTION

Laser cooling of solid state matter has been demonstrated through various experiments as early as 1995 (R. I. Epstein et al., "Observation of laser induced fluorescent cooling of solid", Nature 377, 500-503 (1995)). Basically, a laser is focused to introduce photons into solid state matter containing specific ions. Heat is present in the solid state matter in the form of excited photons in the specific ions. The photons introduced by the laser increase the excitation of the photons in the specific ions until the photons are radiated as fluorescence, the photons of which carry some of the heat away from the solid state matter. The cooling that occurs is referred to as "optical cooling" or "laser cooling". In some materials the fluorescence may be reabsorbed by impurities in the solid state matter, resulting in a reduction (or even reversal) in the cooling procedure.

A specific equation has been developed for the net power transferred to the solid state matter from the laser (R. I. Epstein et al., "Advances in laser cooling of thulium-doped glass", J. Opt. Soc. Am. B 20, 1066-1074 (2003)). If the amount of energy radiated is greater than the laser energy added, cooling occurs. The net power transfer equation describes the probability that an excited ion will emit a photon that is emitted from the solid state matter, referred to as the "external quantum efficiency (EQE). Two basic conditions that dictate net cooling are a high EQE and high purity materials in the solid state matter. In the prior art these conditions are met, at least partially, through the use of various rare-earth ions in fluoride or chloride glasses and crystals with low phonon energy.

It would be highly advantageous, therefore, to remedy the foregoing and other deficiencies inherent in the prior art.

An object of the present invention is to provide laser cooling of modified wafers, including SOI wafers and the like.

Another object of the present invention is to provide laser cooling of modified wafers and the like that include electronic circuits and components.

Another object of the present invention is to provide laser cooling of hot spots in modified wafers and the like.

SUMMARY OF THE INVENTION

Briefly, to achieve the desired objects and aspects of the instant invention in accordance with a preferred embodiment thereof provided is a laser cooling system including an REO layer of single crystal rare earth oxide including at least one rare earth element, light guiding structure positioned on the REO layer so as to introduce energy elements into the REO layer and produce cooling by anti-Stokes fluorescence, and an active layer of single crystal semiconductor material positioned on the REO layer in proximity to the light guiding structure so as to receive the cooling.

The desired objects and aspects of the instant invention are further achieved in accordance with a preferred embodiment that includes a substrate, an REO layer of single crystal rare earth oxide including at least one rare earth element positioned on the surface of the substrate, and an active layer of single crystal semiconductor material positioned on the REO layer to form a semiconductor-on-insulator (SOI) device. Light guiding structure is at least partially formed by the REO layer so as to introduce energy elements into the REO layer and produce cooling by anti-Stokes fluorescence. The active layer of single crystal semiconductor material is positioned on the REO layer in proximity to the light guiding structure so as to receive the cooling.

The desired objects and aspects of the instant invention are further achieved in accordance with a preferred method of fabricating a laser cooling system including the steps of growing an REO layer of single crystal rare earth oxide including at least one rare earth element, forming a light guiding structure by at least partially using the REO layer so as to introduce energy elements into the REO layer and produce cooling by anti-Stokes fluorescence, and positioning an active layer of single crystal semiconductor material on the REO layer in proximity to the light guiding structure so as to receive the cooling.

BRIEF DESCRIPTION OF THE DRAWINGS

Specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
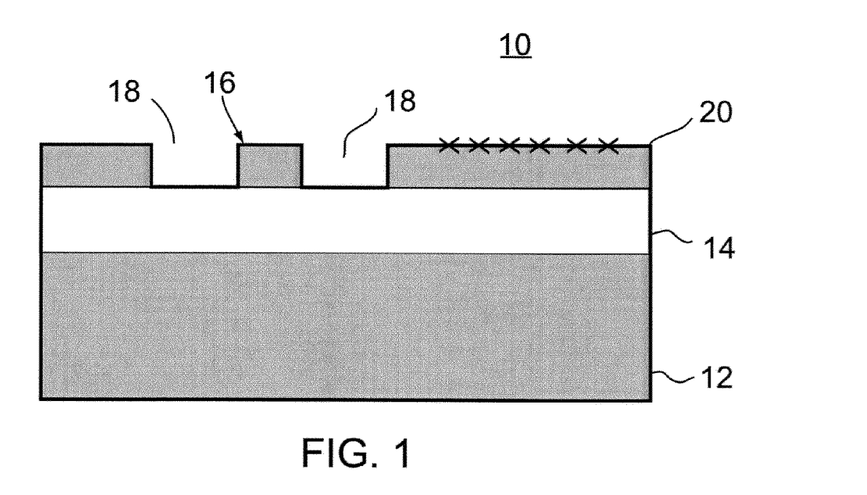
FIG. 1 is a simplified side view of a lateral cooling arrangement in accordance with the present invention.

Turning now to the drawings, attention is first directed to FIG. 1, which illustrates a lateral cooling arrangement 10 in accordance with the present invention. Cooling arrangement 10 includes a substrate 12, which in this example is a traditional silicon chip or wafer (i.e. single crystal silicon). It will be understood that substrate 12 could be formed from any of the well known semiconductor materials, such as silicon, germanium, gallium arsenide, indium antimonide, and could even be simply a supporting substrate formed from material other than semiconductor material.

A layer 14 of rare earth oxide (REO) is deposited on the upper surface of substrate 12. REO layer 14 can be, for example, epitaxially grown and can contain one or more rare earths. Further, REO layer 14 is preferably single crystal (crystalline) rare earth material epitaxially grown directly on the surface of silicon substrate 12.

A waveguide 16 is formed on the upper surface of REO layer 14 with spaces 18 adjacent the sides to act as cladding. Waveguide 16 can be any convenient material that will guide light in the desired path while allowing penetration or introduction of light phonons into REO layer 14 along the path. In a preferred embodiment, waveguide 16 is formed of a material, such as silicon, that can be directly deposited or grown on the surface of REO layer 14 in a single crystal formation and crystal lattice matched to REO layer 14.

An active layer 20 of semiconductor material, such as silicon, germanium, gallium arsenide, indium antimonide, or the like, is deposited or grown on at least a portion of the upper surface of REO layer 14 and micro electronic gates and circuits are fabricated thereon. As understood in the art, active layer 20 is preferably an epitaxially grown layer of single crystal semiconductor material lattice matched to single crystal REO layer 14. Thus, substrate 12, active layer 20, and REO layer 14 essentially form a semiconductor-on-insulator (SOI) device.

The approach of forming single crystal layers (e.g. substrate 12, REO layer 14, active layer 20, etc.) and lattice matching the layers to each other may be used to ensure good crystal lattice contact between two dissimilar materials. In some instances lattice matching may be achieved through the use of transition layers as explained in detail in a copending United States patent application, entitled "High Efficiency Solar Cell Using IIIB Material Transition Layers", filed 19 Feb. 2010, bearing Ser. No. 12/708,969 and incorporated herein by reference. Lattice matching adjacent materials results in extremely good thermal contact since the crystal grades from one to another. Additionally, the lattice matching region can be engineered to assist phonon transfer across the interface, in a similar way to index matching in a waveguide. Also, single crystal REO's have a very high percentage of rare earth ions compared to the existing approaches of using doped crystal. The high percentage of rare earth ions means that there is a greater ability to cool since more ions can potentially contribute. Additionally, the rare earth is a part of the crystal lattice, rather than being a dopant in another crystal lattice, so phonon-ion interaction is improved.

Waveguide 16 formed on the upper surface of REO layer 14 is a film sufficiently thin that an evanescent wave coupled thereto from a laser (not shown) penetrates into REO layer 14. Light could be directed onto the wafer from above or below, but waveguiding is preferable because of the increased intensities that may be achieved. Also, different rare earth elements have different transitions so that several lasers may be employed such that cooling occurs between different energy levels. Different lasers may be tuned to different transitions of the same ion or transitions in different rare earth ions. Waveguide 16 is preferably silicon that can be easily grown and lattice matched onto REO layer 14 and can either allow two-dimensional containment of light (i.e. in a waveguide such as the ridge waveguide illustrated) or one-dimensional containment of light (i.e. in a plane as described further below). It will be understood that active layer 20 and any circuitry formed thereon (illustrated as X's in FIG. 1) is generally encapsulated or otherwise coated with some protective material. Also, any protective coating will generally be deposited in the opening surrounding the sides and top of waveguide 16 and will act, at least partially, as a cladding layer for the wave guiding.

By depositing REO layer 14 as a single crystal (crystalline) rare earth material, the rare earth ions in the crystal lattice have a high external quantum efficiency (EQE) and the crystal lattice has a high purity. Thus, the basic conditions that dictate net cooling are present. Also, the cooling element or system (i.e. REO layer 14) is in close proximity or directly in touch with circuitry formed on active layer 20 so as to provide maximum efficiency. Further, the cooling system is, in this example, integrated into the insulator part of the SOI device to substantially reduce the space required for the overall device.

Figure 2:
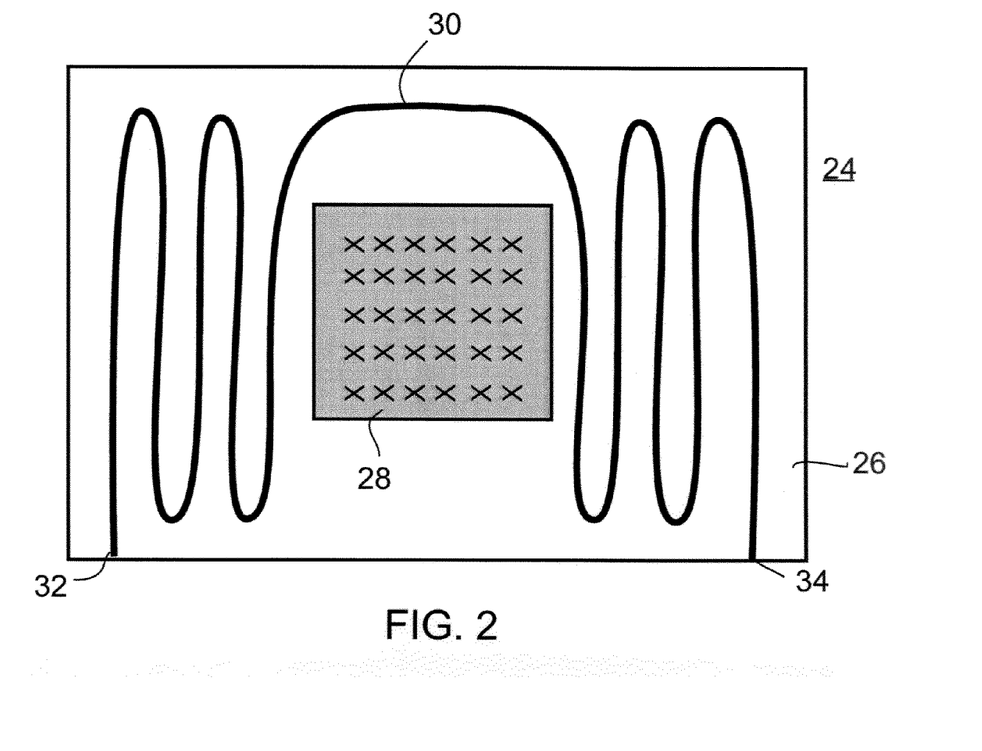
FIG. 2 is a simplified top view of a lateral cooling arrangement in accordance with the present invention.

Referring additionally to FIG. 2, an extended lateral cooling arrangement 24 is illustrated. Generally, lateral cooling arrangement 24 may be similar to cooling arrangement 10 with a rare earth layer 26 deposited or grown on a substrate (not visible). An active layer 28 is formed as an "island" in a central portion of REO layer 26 and circuitry is formed thereon (illustrated as X's in FIG. 2). A waveguide 30 is positioned on the surface of REO layer 26 with a laser light input 32 at one end and a laser light output 34 at the other end. Waveguide 30 is formed in a serpentine path around the surface of REO layer 26 so as to provide the best use of the available real estate. Generally, the length and position of the waveguide path will be determined by the type of circuitry, the heat and position of the heat generated, and the space available. The path illustrated in FIG. 2 is simply one example of a nearly infinite number of paths available. Again, the cooling element or system (i.e. REO layer 26) is in close proximity or directly in touch with circuitry formed on active layer 28 so as to provide maximum efficiency.

Figure 3:
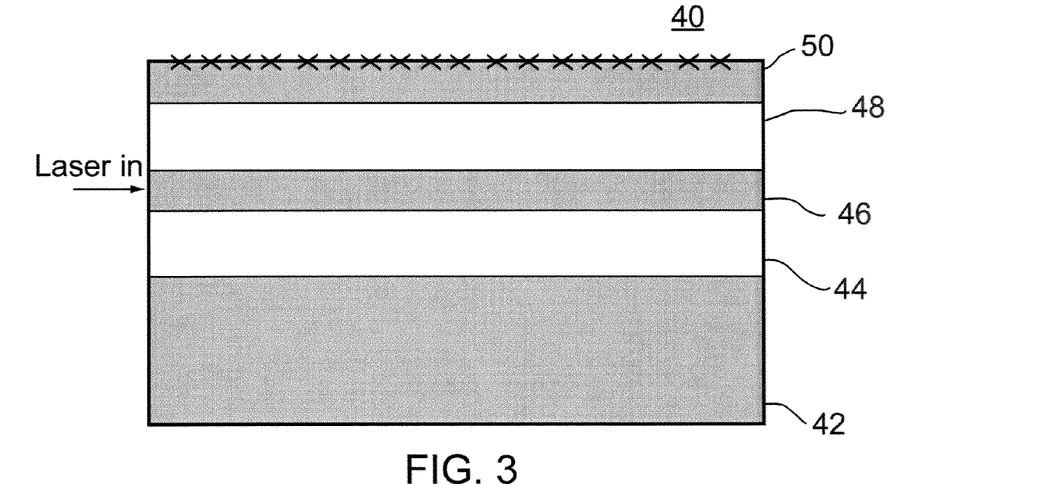
FIG. 3 is a simplified side view of an SOI modified wafer including a lateral cooling arrangement in accordance with the present invention.

Turning to FIG. 3, a different lateral cooling arrangement 40 is illustrated. Cooling arrangement 40 includes a substrate 42 which in this example is a traditional silicon chip or wafer (i.e. single crystal silicon). It will be understood that substrate 42 could be formed from any of the well known semiconductor materials, such as silicon, germanium, gallium arsenide, indium antimonide, and could even be simply a supporting substrate formed from material other than semiconductor material. A first layer 44 of rare earth oxide (REO) is deposited on the upper surface of substrate 42. REO layer 44 can be, for example, epitaxially grown and can contain one or more rare earths. Further, REO layer 44 is preferably single crystal (crystalline) rare earth material epitaxially grown directly on the surface of silicon substrate 42.

Figure 4:
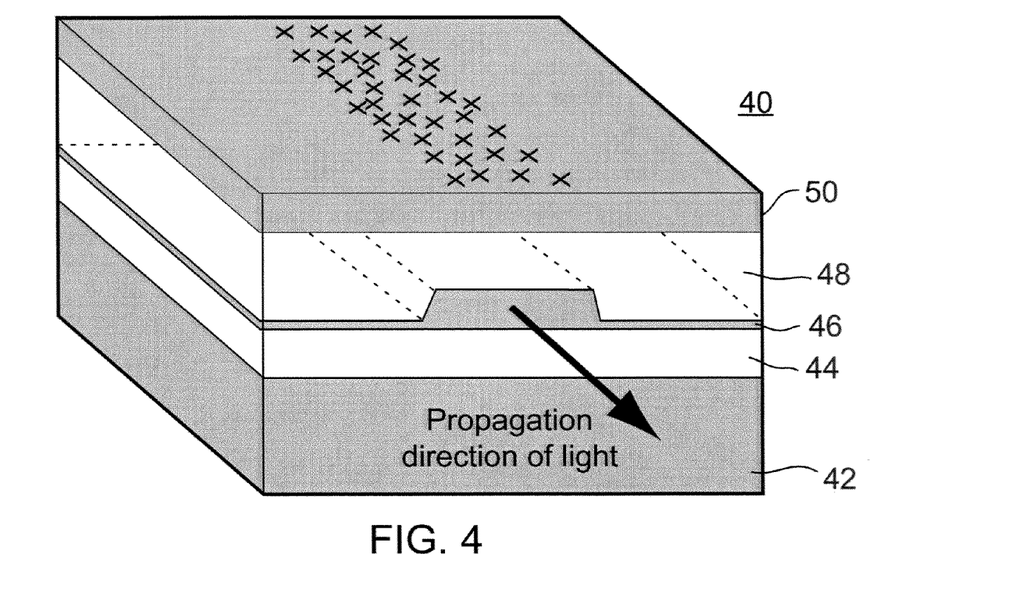
FIG. 4 is a simplified top perspective view of a lateral cooling arrangement, similar to the arrangement illustrated in FIG. 3.

A waveguide 46 is formed on the upper surface of REO layer 44 in any desired pattern. Waveguide 46 is preferably silicon that can be easily grown and lattice matched onto REO layer 44 and can either allow two-dimensional containment of light (i.e. in a waveguide such as the ridge waveguide illustrated in FIG. 1) or one-dimensional containment of light (i.e. in a plane). By confining the laser light to flow in channels or waveguides, greater cooling occurs in the channels than if light was spread evenly across the wafer. Thus, a waveguide can be used to restrict the light to flow in the region it is needed. An example of a ridge waveguide which can be fabricated in cooling arrangement 40 is illustrated in FIG. 4. Waveguide 46 can be deposited or grown in a blanket layer and etched to provide the desired path or it can be patterned during the deposition or growing stage.

Figure 10:
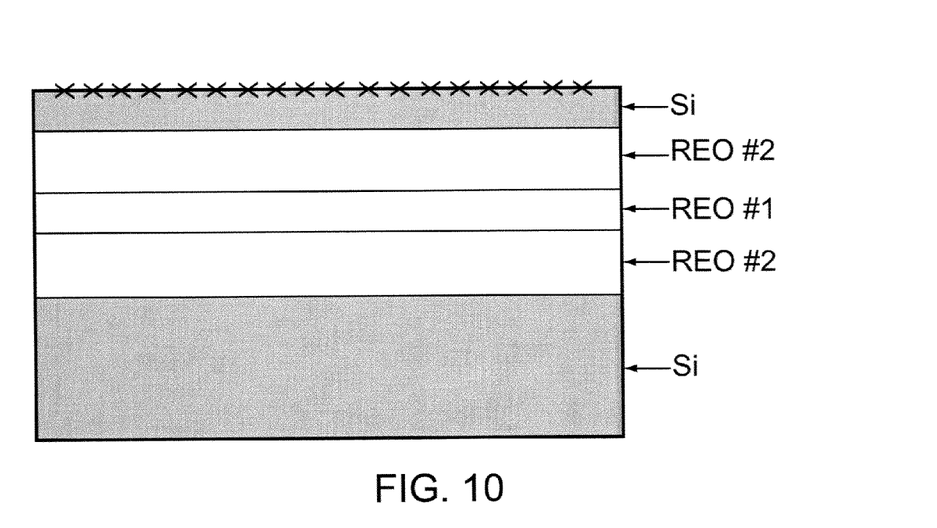
FIG. 10 is a simplified side view of a lateral cooling arrangement incorporating a higher refractive index laser waveguide in accordance with the present invention.

A second REO layer 48 is deposited or grown over waveguide 46 as illustrated in either FIG. 3 or FIG. 4. In lateral cooling arrangement 40, waveguide 46 formed between REO layers 44 and 48 is a film sufficiently thin that an evanescent wave is coupled to both REO layers 44 and 48 from a laser (not shown). Generally, the length and position of the waveguide path will be determined by the type of circuitry, the heat and position of the heat generated, and the space available. Waveguide 46 can also be formed of a rare earth oxide with a higher index of refraction than REO layers 44 and 46 so that the difference between the indices provides a wave guiding or light guiding function, as illustrated in FIG. 10.

An active layer 50 of semiconductor material, such as silicon, germanium, gallium arsenide, indium antimonide, or the like, is deposited or grown on at least a portion of the upper surface of REO layer 48 and micro electronic gates and circuits are fabricated thereon (illustrated as X's in FIGS. 3 and 4). As understood in the art, active layer 50 is preferably an epitaxially grown layer of single crystal semiconductor material lattice matched to single crystal REO layer 48. Thus, substrate 42, active layer 50, and REO layers 44 and 48 essentially form a semiconductor-on-insulator (SOI) device. Also, the cooling element or system (i.e. REO layers 44 and 48) is in close proximity or directly in touch with circuitry formed on active layer 50 so as to provide maximum efficiency.

Figure 5:
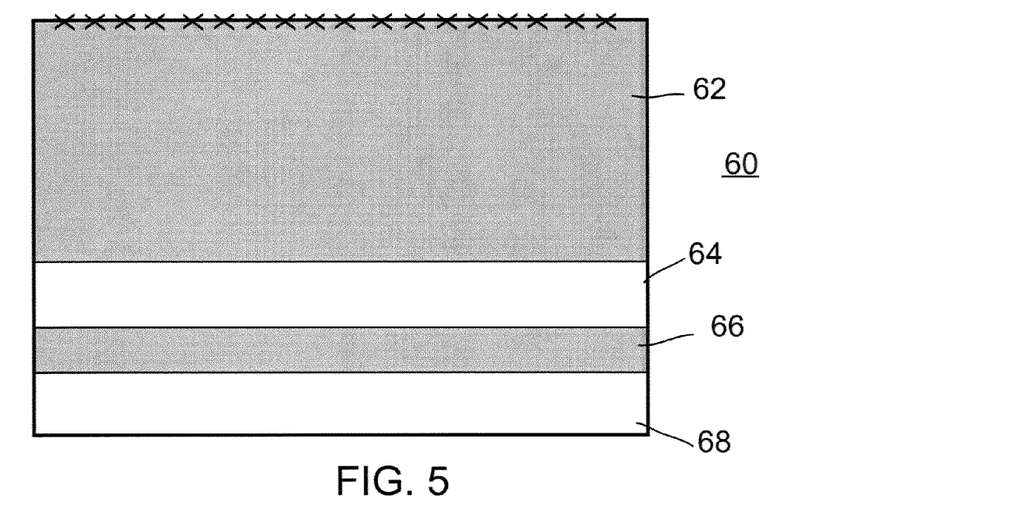
FIG. 5 is a simplified side view of a lateral cooling arrangement on the backside of a wafer in accordance with the present invention.

Turning now to FIG. 5, a lateral cooling arrangement 60 is illustrated as positioned on the back side of a substrate 62. Substrate 62, which is included in cooling arrangement 60, is in this example a traditional silicon chip or wafer (i.e. single crystal silicon). It will be understood that substrate 62 could be formed from any of the well known semiconductor materials, such as silicon, germanium, gallium arsenide, indium antimonide, and the like. A first layer 64 of rare earth oxide (REO) is deposited on the back surface of substrate 62. REO layer 64 can be, for example, epitaxially grown and can contain one or more rare earths. Further, REO layer 64 is preferably single crystal (crystalline) rare earth material epitaxially grown directly on the back surface of substrate 62.

A waveguide 66 is formed on the lower surface of REO layer 64 in any desired pattern. Waveguide 66 is preferably silicon that can be easily grown and lattice matched onto REO layer 64 and can either allow two-dimensional containment of light (i.e. in a waveguide such as the ridge waveguide illustrated in FIG. 1) or one-dimensional containment of light (i.e. in a plane). An example of a ridge waveguide which can be fabricated in cooling arrangement 60 is illustrated in FIG. 4. Waveguide 66 can be deposited or grown in a blanket layer and etched to provide the desired path or it can be patterned during the deposition or growing stage. Waveguide 66 can also be formed of a rare earth oxide with a higher index of refraction than REO layers 64 and 68 so that the difference between the indices provides a wave guiding or light guiding function.

A second REO layer 68 is deposited or grown over waveguide 66 as illustrated in FIG. 5. In lateral cooling arrangement 60, waveguide 66 formed between REO layers 64 and 68 is a film sufficiently thin that an evanescent wave is coupled to both REO layers 64 and 68 from a laser (not shown). Generally, the length and position of the waveguide path will be determined by the type of circuitry, the heat and position of the heat generated, and the space available.

In lateral cooling arrangement 60, substrate 62 is the active layer of semiconductor material and micro electronic gates and circuits are fabricated on the front surface thereof (illustrated as X's in FIG. 5). Thus, substrate 62 and REO layers 64 and 68 essentially form a semiconductor-on-insulator (SOI) device. In this arrangement the cooling element or system (i.e. REO layers 64 and 68) are slightly removed from but still in close proximity with circuitry formed on active layer 50 so as to provide good efficiency. Backside cooling systems similar to cooling arrangement 60 may be relevant to cooling of solar cells in concentrator applications where improved efficiency cooling means more energy is available to the customer.

Figure 6:
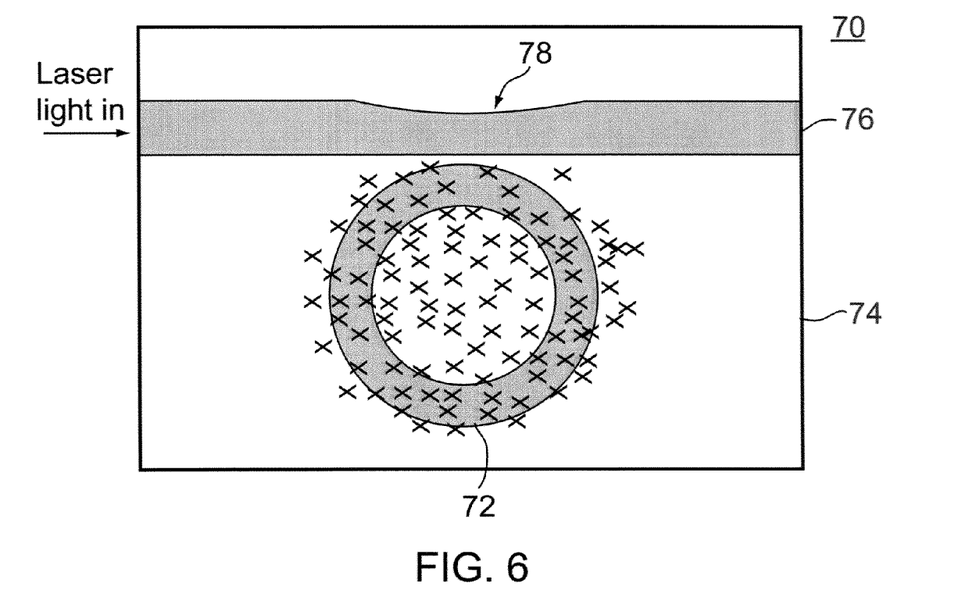
FIG. 6 is a simplified top view of a laser cooling arrangement including an embedded micro-disk resonator to enable localized cooling, in accordance with the present invention.

Referring to FIG. 6, a laser cooling arrangement 70 is illustrated that includes an embedded micro-disk resonator 72 to enable localized cooling. As explained in detail in conjunction with the above arrangements, a rare earth layer 74 is deposited or grown on the surface of a substrate (not visible). A waveguide 76 is formed (grown) on the surface of REO layer 74 and micro-disk resonator 72 is grown in close proximity thereto. Generally, micro-disk resonator 72 and waveguide 76 will be formed in the same process. Further, in this example, waveguide 76 is narrowed slightly adjacent micro-disk resonator 72 and on the opposite edge, designated 78 in FIG. 6. The narrowing of waveguide 76 in the area 78 adjacent to micro-disk resonator 72 promotes coupling into micro-disk resonator 72, which can be used to enable localized cooling for hot spots or specific circuits.

Figure 7:
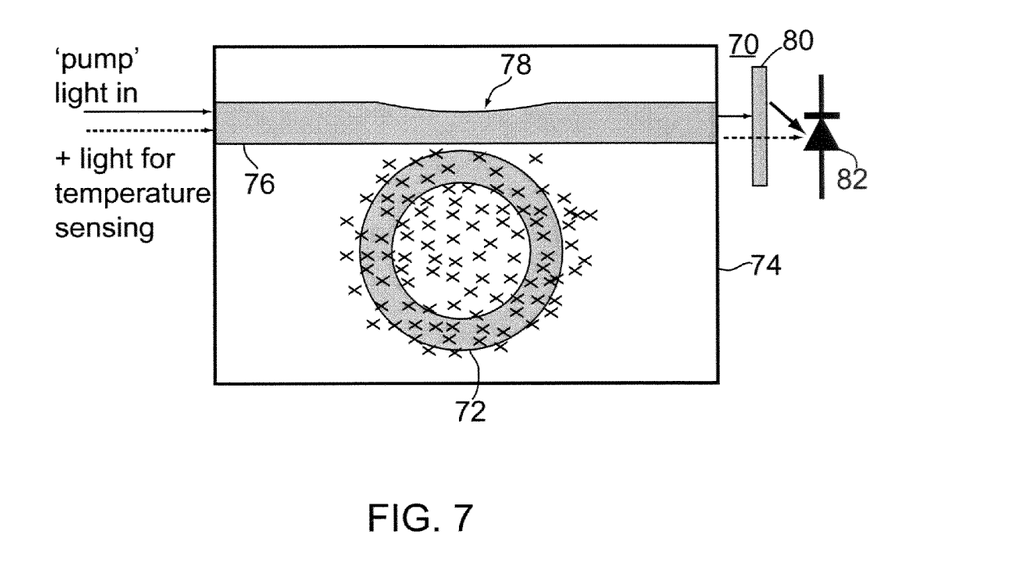
FIG. 7 is a simplified top view of a laser cooling arrangement including an embedded micro-disk resonator used as a temperature sensing element, in accordance with the present invention.

Referring additionally to FIG. 7, additional structure is illustrated for using micro-disk resonator 72 of laser cooling arrangement 70 as a temperature sensing element. In this arrangement temperature sensing is performed by sensing the absorption of the micro resonator. This sensing is accomplished by using a different probe wavelength (pumped light in) so as not to interfere with cooling. Also, a filter 80 is aligned with the waveguide output to screen out light used for the anti-stokes fluorescent cooling. A photodiode 82 is positioned to sense light passing through filter 80. If the laser driving the cooling arrangement is tunable then periodically, for a brief interval, the frequency (wavelength) can be changed or scanned to identify the position of the whispering-gallery-mode resonances, which can be used to reveal the temperature of the cooling element.

Instead of light being guided in a waveguide to produce anti-stokes fluorescent cooling, surface plasmon polaritons (SPPs) may propagate along thin metal films. Surface plasmons are those plasmons that are confined to the surface and that interact strongly with light resulting in polaritons. Surface plasmons, also known as surface plasmon polaritrons, are surface electromagnetic waves that propagate in a direction parallel to the metal films. For purposes of this disclosure the term "light guiding structure" is defined to include waveguides and/or plasmon polariton propagating thin metal films as described herein along with lasers and the like required for activation. Also, the term "energy elements" is defined herein as including either or both phonons generated in a waveguide and plasmons or plasmon polaritons generated in thin metal films.

Figure 8:
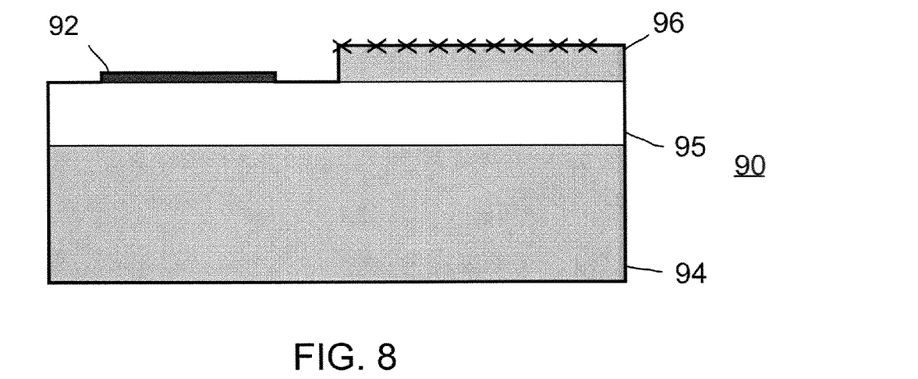
FIG. 8 is a simplified side view of a lateral cooling arrangement using surface plasmon polaritrons propagating along thin metal films for the excitation source in accordance with the present invention.
Figure 9:
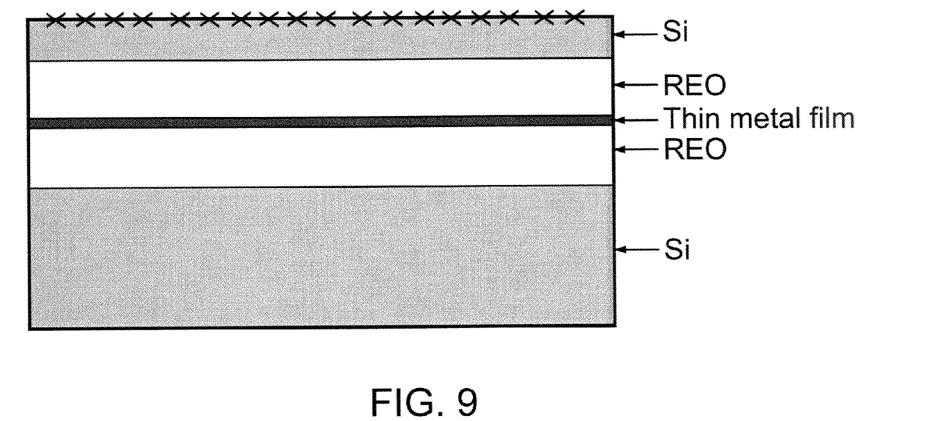
FIG. 9 is a simplified side view of a lateral cooling arrangement with an embedded thin metal film for propagating surface plasmon polaritrons for the excitation source in accordance with the present invention.

Referring to FIG. 8, a lateral cooling arrangement 90 is illustrated using surface plasmon polaritrons propagating along a thin metal film 92. Thin metal film 92 may be for example a noble metal such as gold, etc. The plasmon polaritons are used for the excitation source rather than light waves. Cooling arrangement 90 includes a substrate 94, an REO layer 95, and an active layer 96 substantially as explained with reference to FIG. 1. However, in this example thin metal film 92 is positioned on the upper surface of REO layer 95 adjacent active layer 96. Surface plasmon polaritrons travel perpendicular to the plane of FIG. 8 in thin metal film 92. It should be understood that thin metal film 92 may be a strip to confine the surface plasmons to a desired region (as shown in FIG. 8) or may be a plane covering a whole wafer or chip (as illustrated in FIG. 9).

Figure 11:
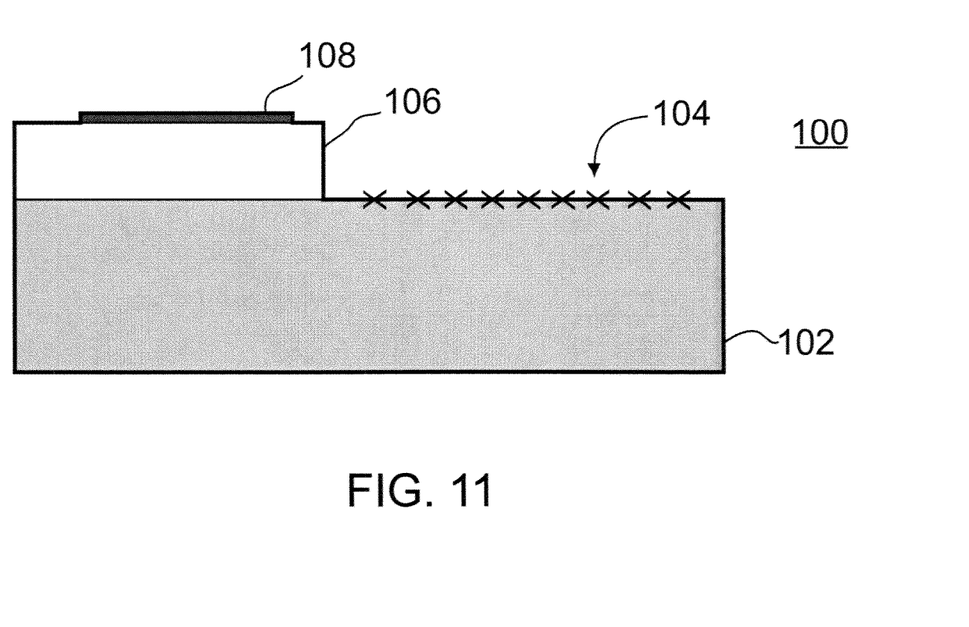
FIG. 11 is a simplified side view of a cooling arrangement other than an SOI wafer using surface plasmon polaritrons propagating along a thin metal film for the excitation source in accordance with the present invention.

In a somewhat different cooling arrangement, designated 100 in FIG. 11, a substrate 102 is provided and circuits are formed in an area 104 of the upper surface. Substrate 102, which is included in cooling arrangement 100, is in this example a traditional silicon chip or wafer (i.e. single crystal silicon). It will be understood that substrate 102 could be formed from any of the well known semiconductor materials, such as silicon, germanium, gallium arsenide, indium antimonide, and the like. An REO layer 106 is positioned on a portion of the upper surface of substrate 102 and may be formed as a blanket layer and etched to expose area 104 or it may be patterned or selectively deposited in any well known procedure. REO layer 106 can be, for example, epitaxially grown and can contain one or more rare earths. Further, REO layer 106 is preferably single crystal (crystalline) rare earth material epitaxially grown directly on the surface of silicon substrate 102.

A waveguide, similar to that shown in FIG. 1, can be formed on the surface of REO layer 106 to guide light for producing anti-stokes fluorescent cooling as explained above or a thin metal film 108 can be deposited on the upper surface of REO layer 106 to generate surface plasmon polaritons for anti-stokes fluorescent cooling. Alternatively, additional REO layers can be formed on the surface of REO layer 106 to provide waveguides as explained in conjunction with FIGS. 3 and 10. Thus an electronic device other than an SOI device can be formed using the above described techniques and structures.

Thus, laser cooling of modified wafers, including SOI wafers, non-SOI wafers, and combinations thereof, is disclosed. In the preferred embodiment the cooling elements are included in the insulator layer of the SOI wafer so as to be in close proximity with electronic circuits and to substantially reduce the space required for the overall structure. The disclosed structures are relatively simple to fabricate because the rare earth layers providing the cooling can be deposited epitaxially and can be single crystal material lattice matched to the substrate and/or an active layer deposited thereon. Because of the rare earth material used and the manner of deposition, the basic conditions that dictate net cooling are present. Since the rare earth is the active component of the cooling system, having extremely high concentrations of the rare earth, such as in a single crystal REO layer means that cooling in rare earth oxides is significantly greater than in the existing prior art crystals. Also, the cooling element or system is in close proximity or directly in touch with circuitry formed on the active layer so as to provide maximum efficiency. Further, the cooling system is, in at least some of the examples, integrated into the insulator part of the SOI device to substantially reduce the space required for the overall device.

Various changes and modifications to the embodiments herein chosen for purposes of illustration will readily occur to those skilled in the art. To the extent that such modifications and variations do not depart from the spirit of the invention, they are intended to be included within the scope thereof, which is assessed only by a fair interpretation of the following claims.

Having fully described the invention in such clear and concise terms as to enable those skilled in the art to understand and practice the same, the invention claimed is:

1. A laser cooling system comprising:
   an REO layer of single crystal rare earth oxide including at least one rare earth element;
   light guiding structure positioned on the REO layer so as to introduce energy elements into the REO layer and produce cooling by anti-Stokes fluorescence; and
   an active layer of single crystal semiconductor material positioned on the REO layer in proximity to the light guiding structure so as to receive the cooling.

2. A laser cooling system as claimed in claim 1 wherein the light guiding structure is a waveguide of single crystal material.

3. A laser cooling system as claimed in claim 2 wherein the light guiding structure is crystal lattice matched to the REO layer, and the active layer is crystal lattice matched to the REO layer.

4. A laser cooling system as claimed in claim 1 wherein the active layer includes a substrate of single crystal semiconductor material including a back side and a front side.

5. A laser cooling system as claimed in claim 4 wherein the REO layer is positioned on a portion of the front side of the substrate and electronic circuitry is fabricated on a different portion of the front side of the substrate.

6. A laser cooling system as claimed in claim 4 wherein the REO layer is positioned on a portion of the back side of the substrate and electronic circuitry is fabricated on a portion of the front side of the substrate.

7. A laser cooling system as claimed in claim 1 wherein the light guiding structure includes a waveguide of single crystal material positioned on a surface of the REO layer and a second REO layer is positioned over the waveguide of single crystal material to form cladding layers around the waveguide.

8. A laser cooling system as claimed in claim 1 wherein the REO layer of single crystal rare earth oxide provides a first layer of the light guiding structure, a second REO layer is positioned on the first layer and a third REO layer is positioned on the second REO layer, the second REO layer has a higher index of refraction than the first layer and the third REO layer so that Waveguiding occurs in the second REO layer.

9. A laser cooling system as claimed in claim 1 wherein the light guiding structure includes a waveguide with a micro disk resonator coupled thereto so as to provide localized cooling adjacent the micro-disk resonator.

10. A laser cooling system comprising:
    a substrate having a surface;
    an REO layer of single crystal rare earth oxide including at least one rare earth element positioned on the surface of the substrate;
    an active layer of single crystal semiconductor material positioned on the REO layer to form a semiconductor-on-insulator (SOI) device;
    light guiding structure at least partially formed by the REO layer so as to introduce energy elements into the REO layer and produce cooling by anti-Stokes fluorescence; and
    the active layer of single crystal semiconductor material positioned on the REO layer in proximity to the light guiding structure so as to receive the cooling.

11. A laser cooling system as claimed in claim 10 wherein the substrate includes single crystal semiconductor material and the REO layer of single crystal rare earth oxide is crystal lattice matched to the surface.

12. A laser cooling system as claimed in claim 10 wherein the light guiding structure includes a waveguide of single crystal material positioned on a surface of the REO layer and a second REO layer is positioned over the waveguide of single crystal material to form cladding layers around the waveguide.

13. A laser cooling system as claimed in claim 10 wherein the REO layer of single crystal rare earth oxide provides a first layer of the light guiding structure, a second REO layer is positioned on the first layer and a third REO layer is positioned on the second REO layer, the second REO layer has a higher index of refraction than the first layer and the third REO layer so that Waveguiding occurs in the second REO layer.

14. A laser cooling system as claimed in claim 10 wherein the light guiding structure is a waveguide of single crystal material.

15. A laser cooling system as claimed in claim 14 wherein the light guiding structure is crystal lattice matched to the REO layer, and the active layer is crystal lattice matched to the REO layer.

16. A method of fabricating a laser cooling system comprising the steps of:
growing an REO layer of single crystal rare earth oxide including at least one rare earth element;
forming a light guiding structure by at least partially using the REO layer so as to introduce energy elements into the REO layer and produce cooling by anti-Stokes fluorescence; and
positioning an active layer of single crystal semiconductor material on the REO layer in proximity to the light guiding structure so as to receive the cooling.

17. A method as claimed in claim 16 wherein the steps of growing an REO layer and positioning an active layer include epitaxially growing the REO layer and the active layer.

18. A method as claimed in claim 16 wherein the steps of growing the REO layer and positioning the active layer include crystal lattice matching the REO layer and the active layer to each other.

19. A method as claimed in claim 16 wherein the step of growing an REO layer includes growing an REO layer on a surface of a substrate.

20. A method as claimed in claim 19 wherein the step of growing the REO layer on a surface of the substrate includes providing a single crystal semiconductor chip/wafer and crystal lattice matching the REO layer to the single crystal semiconductor chip/wafer.

21. A method as claimed in claim 16 further including a step of fabricating electronic circuits in the active layer.

22. A laser cooling system comprising:
a single crystal silicon substrate having a surface;
an REO layer of single crystal insulating rare earth oxide including at least one rare earth element positioned on the surface of the substrate and substantially crystal lattice matched to the silicon substrate;
an active layer of single crystal semiconductor material positioned on the REO layer to form a semiconductor-on-insulator (SOI) device, the active layer being substantially crystal lattice matched to the REO layer;
light guiding structure at least partially formed by the REO layer so as to introduce energy elements into the REO layer and produce cooling by anti-Stokes fluorescence; and
the active layer of single crystal semiconductor material positioned on the REO layer in proximity to the light guiding structure so as to receive the cooling.

23. A laser cooling system as claimed in claim 22 wherein the light guiding structure is a waveguide of single crystal material positioned on the REO layer and substantially crystal lattice matched to the REO layer.

24. A laser cooling system as claimed in claim 23 wherein the waveguide of single crystal material includes silicon.

* * * * *